United States Patent
Hosoda et al.

(10) Patent No.: US 10,448,506 B2
(45) Date of Patent: Oct. 15, 2019

(54) WIRING SUBSTRATE AND PROCESS FOR PRODUCING IT

(71) Applicant: AGC Inc., Chiyoda-ku (JP)

(72) Inventors: Tomoya Hosoda, Chiyoda-ku (JP); Tatsuya Terada, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 16/238,586

(22) Filed: Jan. 3, 2019

(65) Prior Publication Data
US 2019/0141833 A1 May 9, 2019

Related U.S. Application Data

(63) Continuation of application No. PCT/JP2017/031471, filed on Aug. 31, 2017.

(30) Foreign Application Priority Data

Sep. 1, 2016 (JP) .................. 2016-171195

(51) Int. Cl.
*H05K 1/03* (2006.01)
*H05K 1/11* (2006.01)
(Continued)

(52) U.S. Cl.
CPC .......... *H05K 1/0373* (2013.01); *H05K 1/024* (2013.01); *H05K 1/03* (2013.01); *H05K 1/11* (2013.01);
(Continued)

(58) Field of Classification Search
CPC ...... H05K 1/0373; H05K 1/115; H05K 1/024; H05K 2201/0212; H05K 2201/0154; H05K 3/422
(Continued)

(56) References Cited

U.S. PATENT DOCUMENTS

2001/0042637 A1* 11/2001 Hirose ................ H05K 3/0035
174/255
2005/0100720 A1* 5/2005 Shirai ................... H05K 3/421
428/209
(Continued)

FOREIGN PATENT DOCUMENTS

JP 2001-7466 1/2001
JP 2004-335506 11/2004
(Continued)

OTHER PUBLICATIONS

International Search Report dated Nov. 28, 2017 in PCT/JP2017/031471, filed on Aug. 31, 2017 (with English Translation).

*Primary Examiner* — Sherman Ng
(74) *Attorney, Agent, or Firm* — Oblon, McClelland, Maier & Neustadt, L.L.P.

(57) ABSTRACT

To provide a wiring substrate having excellent transmission characteristics, of which initial failure of a plating layer formed on an inner wall surface of a hole is suppressed regardless of the type of the pre-treatment applied to the inner wall surface of the hole, and of which the plating layer has favorable heat resistance, and a process for producing it. A wiring substrate 10 comprising an electrical insulator layer 20, a first conductor layer 32 formed on a first surface of the electrical insulator layer 20, a second conductor layer 34 formed on a second surface of the electrical insulator layer 20, and a plating layer 42 provided on an inner wall surface of a hole 40 which opens from the first conductor layer 32 through the second conductor layer 34; wherein the electrical insulator layer 20 has a heat resistant resin layer 22 containing a heat resistant resin and a resin powder; the resin powder is formed from a resin material containing a meltformable fluororesin having a functional group such as a carbonyl group-containing group; the content of the resin (Continued)

powder is from 5 to 70 mass % to the heat resistant resin layer 22; and the electrical insulator layer 20 has a dielectric constant of from 2.0 to 3.5.

13 Claims, 4 Drawing Sheets

(51) Int. Cl.
- *H05K 3/18* (2006.01)
- *H05K 3/40* (2006.01)
- *H05K 1/02* (2006.01)
- *H05K 3/42* (2006.01)
- *H01Q 1/38* (2006.01)

(52) U.S. Cl.
CPC ............... *H05K 1/115* (2013.01); *H05K 3/18* (2013.01); *H05K 3/40* (2013.01); *H05K 3/422* (2013.01); *H01Q 1/38* (2013.01); *H05K 1/0393* (2013.01); *H05K 2201/0154* (2013.01); *H05K 2201/0212* (2013.01); *H05K 2203/072* (2013.01); *H05K 2203/0776* (2013.01); *H05K 2203/0779* (2013.01); *H05K 2203/095* (2013.01)

(58) Field of Classification Search
USPC .......................................................... 174/258
See application file for complete search history.

(56) References Cited

U.S. PATENT DOCUMENTS

| | | | |
|---|---|---|---|
| 2005/0202261 A1* | 9/2005 | Takai ..................... | H05K 3/28 428/458 |
| 2007/0007033 A1* | 1/2007 | Das ..................... | H05K 3/4069 174/257 |
| 2008/0011507 A1* | 1/2008 | Vasoya ................ | H05K 3/4608 174/260 |
| 2008/0233513 A1* | 9/2008 | Komatsu ............ | C08G 73/1025 430/270.1 |
| 2012/0247819 A1* | 10/2012 | Tsuyutani ........... | H01L 23/5389 174/257 |
| 2014/0339463 A1 | 11/2014 | Saijo et al. | |
| 2017/0118837 A1 | 4/2017 | Miura et al. | |
| 2017/0130009 A1 | 5/2017 | Hosoda et al. | |

FOREIGN PATENT DOCUMENTS

| | | |
|---|---|---|
| JP | 2007-314720 | 12/2007 |
| JP | 2013-69836 | 4/2013 |
| JP | 2015-56558 | 3/2015 |
| JP | 2016-1728 | 1/2016 |
| JP | WO2016/017801 | 2/2016 |
| JP | WO2017/069216 | 4/2017 |
| JP | WO2017/069217 | 4/2017 |

\* cited by examiner (a1)

(a2),(a3)

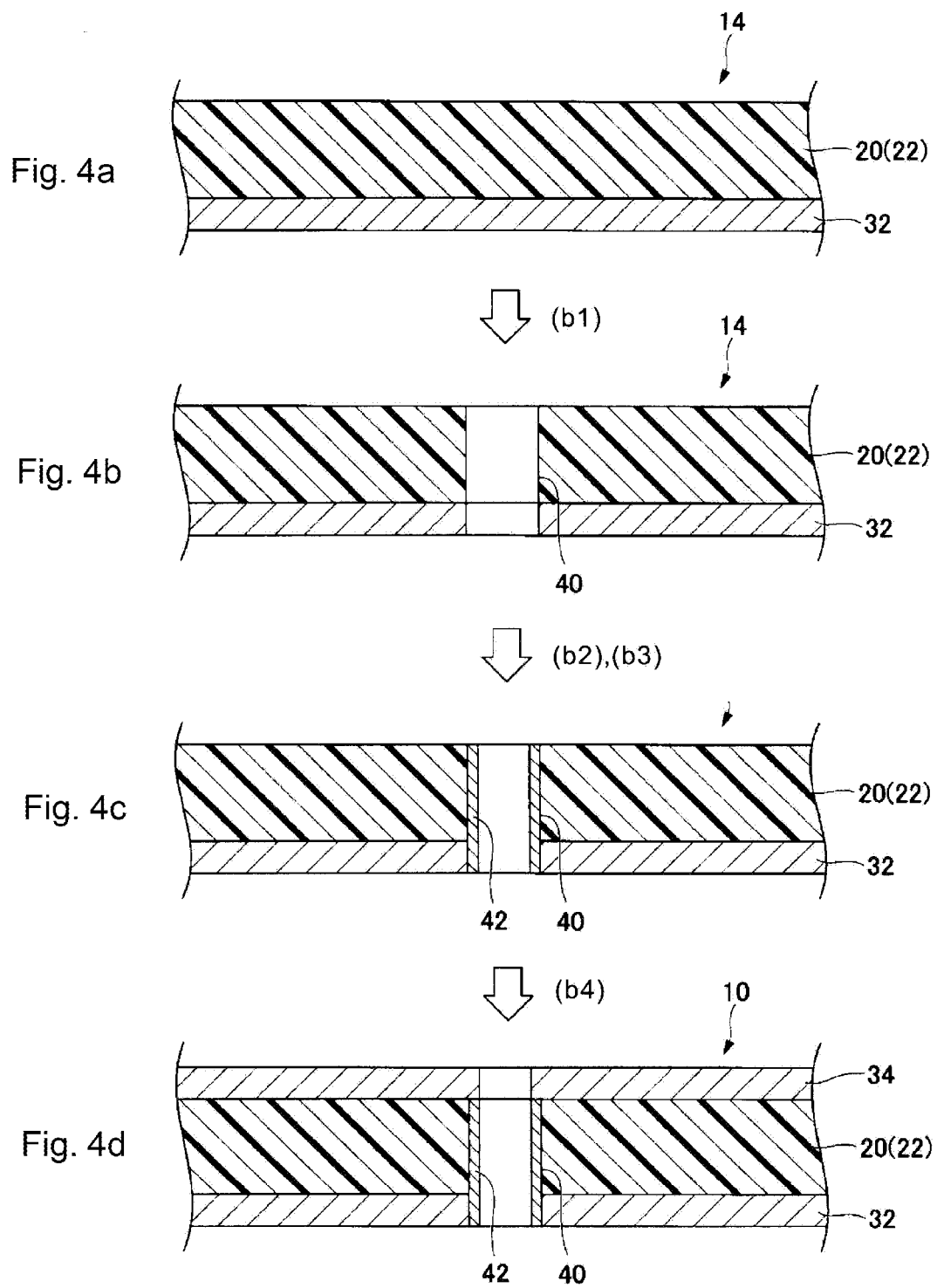

WIRING SUBSTRATE AND PROCESS FOR PRODUCING IT

TECHNICAL FIELD

The present invention relates to a wiring substrate and a process for producing it.

BACKGROUND ART

The wiring substrate used for transmitting high frequency signals is required to have excellent transmission characteristics, that is, small transmission delay and small transmission loss. In order to improve the transmission characteristics, it is necessary to use, as an insulating material of an electrical insulator layer of a wiring substrate, a material having a low dielectric constant and a low dielectric dissipation factor. As an insulating material having a low dielectric constant and a low dielectric dissipation factor, a fluororesin has been known.

As a wiring substrate using a fluororesin as an insulating material of an electrical insulator layer, for example, the following have been proposed.

(1) A high frequency wiring substrate having a dielectric layer of e.g. polytetrafluoroethylene (PTFE) formed on the surface of a metal substrate (Patent Document 1).

(2) A printed wiring board having an electrical insulator layer containing a fluorinated copolymer having acid anhydride residues and a conductor layer in contact with the electrical insulator layer (Patent Document 2).

PRIOR ART DOCUMENTS

Patent Documents

Patent Document 1: JP-A-2001-007466
Patent Document 2: JP-A-2007-314720

DISCLOSURE OF INVENTION

Technical Problem

In a case where in a wiring substrate using a fluororesin as an insulating material of an electrical insulator layer, a hole (such as a through-hole) is formed and a plating layer is formed on the inner wall surface of the hole, in order to secure adhesion between the inner wall surface of the hole and the plating layer and to suppress conduction failure, a pre-treatment is applied to the inner wall surface of the hole. In a case where the electrical insulator layer contains a fluororesin, as a pre-treatment, an etching treatment with an etching liquid having metal sodium dissolved in tetrahydrofuran is selected. However, an etching treatment using metal sodium has the following problems.

Metal sodium requires strict attention for its handling and storage area.

Since an organic solvent is used in a large amount, the work environment tends to be deteriorated.

Waste disposal of the etching liquid requires great care.

Pre-treatments other than the etching treatment with metal sodium (for example, a treatment with a permanganic acid solution or a plasma treatment) have been known. However, in a case where the electrical insulator layer contains a fluororesin, such pre-treatments have the following problems.

The inner wall surface of the hole repels the plating liquid, whereby a plating layer is not sufficiently formed on the inner wall surface of the hole, thus leading to initial failure.

Even if a plating layer is formed on the inner wall surface of the hole, adhesion of the plating layer to the inner wall surface of the hole tends to be insufficient, and conduction failure tends to occur in the plating layer due to repeated temperature changes, that is, the heat resistance of the plating layer is insufficient.

The present invention provides a wiring substrate having excellent transmission characteristics, of which the initial failure of a plating layer formed on an inner wall surface of a hole is suppressed regardless of the type of the pre-treatment applied to the inner wall surface of the hole, and of which the plating layer has favorable heat resistance; and a process for producing a wiring substrate, capable of producing a wiring substrate having excellent transmission characteristics, and capable of forming on an inner wall surface of a hole a plating layer of which initial failure is suppressed regardless of the type of the pre-treatment applied to the inner wall surface of the hole and which has favorable heat resistance.

Solution to Problem

The present invention has the following constitutions.

<1> A wiring substrate comprising:

an electrical insulator layer, a first conductor layer formed on a first surface of the electrical insulator layer, a second conductor layer formed on a second surface opposite from the first surface of the electrical insulator layer, and a plating layer formed on an inner wall surface of a hole which opens from the first conductor layer through the second conductor layer, wherein the electrical insulator layer has a heat resistant resin layer containing a heat resistant resin and a resin powder, the resin powder is formed from a resin material containing a melt-formable fluororesin having at least one type of functional group selected from the group consisting of a carbonyl group-containing group, a hydroxy group, an epoxy group and an isocyanate group, the content of the resin powder is from 5 to 70 mass % to the heat resistant resin layer, and the electrical insulator layer has a dielectric constant of from 2.0 to 3.5.

<2> The wiring substrate according to the above <1>, wherein the fluororesin has a melting point of at least 260° C.

<3> The wiring substrate according to the above <1> or <2>, wherein at least one type of the functional group is a carbonyl group-containing group, and the carbonyl group-containing group is at least one member selected from the group consisting of a group having a carbonyl group between carbon atoms of a hydrocarbon group, a carbonate group, a carboxy group, a haloformyl group, an alkoxycarbonyl group and an acid anhydride residue.

<4> The wiring substrate according to any one of the above <1> to <3>, wherein the content of the functional groups in the fluororesin is from 10 to 60,000 groups per $1 \times 10^6$ carbon atoms in the main chain of the fluororesin.

<5> The wiring substrate according to any one of the above <1> to <4>, wherein the electrical insulator layer has a dielectric constant of from 2.0 to 3.0.

<6> The wiring substrate according to any one of the above <1> to 5, wherein the electrical insulator layer has a linear expansion coefficient of from 0 to 100 ppm/° C.

<7> The wiring substrate according to any one of the above <1> to <6>, wherein the average particle size of the resin powder is from 0.02 to 5 μm, and $D_{90}$ of the resin powder is at most 6 μm.

<8> The wiring substrate according to any one of the above <1> to <7>, wherein the water droplet contact angle of the electrical insulator layer is from 60° to 100°.

<9> The wiring substrate according to any one of the above <1> to <8>, wherein the average particle size of the resin powder contained in the electrical insulator layer is from 1 to 7 μm.

<10> The wiring substrate according to any one of the above <1> to <9>, wherein the rate of change of the resistance of the wiring substrate at 260° C. in the 100th cycle of a thermal shock test to the resistance of the wiring substrate at 260° C. in the first cycle of a thermal shock test is within ±10%.

<11> A process for producing the wiring substrate as defined in any one of the above <1> to <10>, which comprises:
forming the hole in a laminate comprising the first conductor layer, the electrical insulator layer and the second conductor layer laminated in this order;
applying a pre-treatment to the inner wall surface of the hole, and
forming the plating layer on the inner wall surface of the hole having a pre-treatment applied thereto.

<12> A process for producing the wiring substrate as defined in any one of the above <1> to <10>, which comprises:
forming the hole in a laminate having the first conductor layer laminated on the first surface of the electrical insulator layer;
applying a pre-treatment to the inner wall surface of the hole,
forming the plating layer on the inner wall surface of the hole having a pre-treatment applied thereto, and
forming the second conductor layer on the second surface of the electrical insulator layer.

<13> The process for producing the wiring substrate according to the above <11> or <12>, wherein as the pre-treatment, either one or both of a treatment with a permanganic acid solution and a plasma treatment is conducted without conducting an etching treatment using metal sodium.

Advantageous Effects of Invention

The wiring substrate of the present invention is a wiring substrate having excellent transmission characteristics, of which initial failure of a plating layer formed on an inner wall surface of a hole is suppressed regardless of the type of the pre-treatment applied to the inner wall surface of the hole, and of which the plating layer has favorable heat resistance.

According to the process for producing a wiring substrate of the present invention, it is possible to produce a wiring substrate having excellent transmission characteristics, and it is possible to form on an inner wall surface of a hole a plating layer of which initial failure is suppressed regardless of the type of the pre-treatment applied to the inner wall surface of the hole and which has favorable heat resistance.

BRIEF DESCRIPTION OF DRAWINGS

FIG. 3b is a cross-sectional view schematically illustrating a step of forming a hole in the laminate shown in FIG. 3a.

FIG. 4a is a cross-sectional view schematically illustrating another example of a laminate used in a process for producing a wiring substrate of the present invention. FIG. 4b is a cross-sectional view schematically illustrating a step of forming a hole in the laminate shown in FIG. 4a. FIG. 4c is a cross-sectional view schematically illustrating an example of a step of forming a plating layer on the inner wall surface of the hole in the laminate shown in FIG. 4b. FIG. 4d is a cross-sectional view schematically illustrating a step of forming a second conductor layer on a second surface side of an electrical insulator layer of the laminate shown in FIG. 4c.

DESCRIPTION OF EMBODIMENTS

Figure 1:
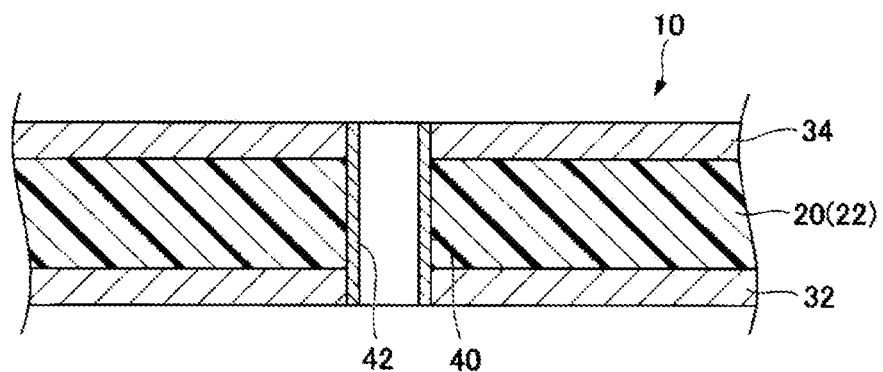
FIG. 1 is a cross-sectional view schematically illustrating an example of a wiring substrate of the present invention.

A "heat resistant resin" means a polymer compound having a melting point of at least 280° C. or a polymer compound having a maximum allowable temperature as defined by JIS C4003:2010 (IEC 60085:2007) of at least 121° C.

"Melt-formable" means having melt flowability.

"Having melt-flowability" means that a temperature at which the melt flow rate is from 0.1 to 1,000 g/10 min is present at a temperature higher by at least 20° C. than the melting point of the resin under a load of 49 N.

The "melting point" means a temperature corresponding to the maximum value of the melting peak measured by differential scanning calorimetry (DSC) method.

The "melt flow rate" means the melt mass flow rate (MFR) as defined in JIS K7210:1999 (ISO1133:1997).

A "unit" in a polymer means an atomic group derived from a monomer formed by polymerization of the monomer. The unit may be an atomic group directly formed by polymerization, or may be an atomic group having a part of the atomic group converted to another structure by treating the polymer.

«Wiring Substrate»

The wiring substrate of the present invention comprises an electrical insulator layer; a first conductor layer formed on a first surface of the electrical insulator layer; a second conductor layer formed on a second surface opposite from the first surface of the electrical insulator layer; and a plating layer formed on an inner wall surface of a hole (such as a through-hole) which opens from the first conductor layer through the second conductor layer.

The wiring substrate of the present invention may be a flexible circuit board wherein the electrical insulator layer contains no reinforcing fiber substrate, or may be a rigid circuit board wherein the electrical insulator layer contains a reinforcing fiber substrate.

The wiring substrate of the present invention may have one electrical insulator layer, or two or more electrical insulator layers.

The wiring substrate of the present invention may have two conductor layers, or three or more conductor layers.

The wiring substrate of the present invention may have, within a range not to impair the effects of the present invention, as the case requires, a layer other than the electrical insulator layer and the conductor layers.

In a case where the wiring substrate is a flexible circuit board, the thickness of the wiring substrate is preferably from 10 to 1,500 μm, more preferably from 12 to 200 μm. When the thickness of the wiring substrate is at least the lower limit value of the above range, deformation such as warpage is suppressed. When the thickness of the wiring substrate is at most the upper limit value of the above range, the wiring substrate is excellent in flexibility and applicable as a flexible circuit board.

In a case where the wiring substrate is a rigid circuit board, the thickness of the wiring substrate is preferably from 10 to 5,000 μm, more preferably from 20 to 3,000 μm, further preferably from 30 to 2,000 μm. When the thickness of the wiring substrate is at least the lower limit value of the above range, deformation such as warpage is suppressed. The thickness of the wiring substrate being at most the upper limit value of the above range will contribute to downsizing and weight saving of the wiring substrate.

The rate of change of the resistance of the wiring substrate at 260° C. in the 100th cycle of a thermal shock test of conducting 100 cycles each comprising leaving the wiring substrate in an environment of 20° C. for 30 seconds and then leaving it in an environment of 260° C. for 30 seconds, to the resistance of the wiring substrate at 260° C. in the first cycle of the thermal shock test, is preferably within a range of ±10%. When the rate of change is within a range of ±10%, such a wiring substrate is excellent in heat resistance. The absolute value of the rate of change tends to be small by using a fluororesin having a high melting point, a heat resistant resin having a high melting point or a thermosetting heat resistant resin.

FIG. 1 is a cross-sectional view schematically illustrating an example of a wiring substrate of the present invention.

A wiring substrate 10 comprises an electrical insulator layer 20; a first conductor layer 32 formed on a first surface of the electrical insulator layer 20; a second conductor layer 34 formed on a second surface opposite from the first surface of the electrical insulator layer 20; and a plating layer 42 formed on an inner wall surface of a hole 40 (such as a through-hole) which opens from the first conductor layer 32 through the second conductor layer 34.

The electrical insulator layer 20 consists solely of a heat resistant resin layer 22.

Figure 2:
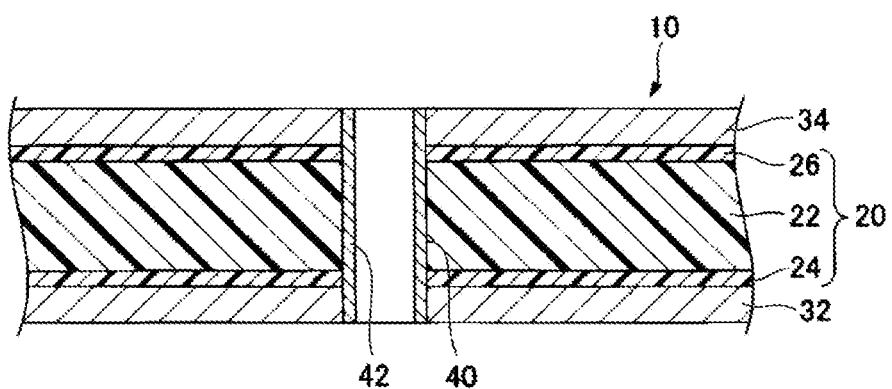
FIG. 2 is a cross-sectional view schematically illustrating another example of a wiring substrate of the present invention.

FIG. 2 is a cross-sectional view schematically illustrating another example of a wiring substrate of the present invention.

A wiring substrate 10 comprises an electrical insulator layer 20; a first conductor layer 32 formed on a first surface of the electrical insulator layer 20; a second conductor layer 34 formed on a second surface opposite from the first surface of the electrical insulator layer 20; and a plating layer 42 formed on an inner wall surface of a hole 40 (such as a through-hole) which opens from the first conductor layer 32 through the second conductor layer 34.

The electrical insulator layer 20 comprises a heat resistant resin layer 22; a first adhesive layer 24 formed on a first surface of the heat resistant resin layer 22 to be in contact with the first conductor layer 32; and a second adhesive layer 26 formed on a second surface of the heat resistant resin layer 22 to be in contact with the second conductor layer 34.

<Electrical Insulator Layer>

The electrical insulator layer 20 has a heat resistant resin layer. The electrical insulator layer may have one heat resistant resin layer, or two or more heat resistant resin layers.

The electrical insulator layer may have, within a range not to impair the effects of the present invention, as the case requires, an adhesive layer on either one or both of a first surface and a second surface of the heat resistant resin layer.

The electrical insulator layer may have, within a range not to impair the effects of the present invention, as the case requires, a layer other than the heat resistant resin layer and the adhesive layer.

The dielectric constant of the electrical insulator layer is from 2.0 to 3.5, preferably from 2.0 to 3.3, more preferably from 2.6 to 3.2. When the dielectric constant of the electrical insulator layer is at most the upper limit value of the above range, such a wiring substrate is useful for an application for which a low dielectric constant is required, such as an antenna. When the dielectric constant of the electrical insulator layer is at least the lower limit value of the above range, such a wiring substrate is excellent in transmission characteristics. Further, the inner wall surface of the hole after the pre-treatment in the wiring substrate will be excellent in lyophilicity. Further, the adhesion between the inner wall surface of the hole after the pre-treatment and the plating layer in the wiring substrate will be excellent.

The dielectric constant of the electrical insulator layer is a value measured by split post dielectric resonator method (SPDR method) at a temperature of 23° C.±2° C. under a relative humidity of 50±5% RH at a frequency of 2.5 GHz.

The water droplet contact angle of the electrical insulator layer is preferably from 60 to 100°, more preferably from 65 to 97°, further preferably from 70 to 95°, particularly preferably from 75 to 90°. When the water droplet contact angle is at most the upper limit value of the above range, the plating liquid will infiltrate into the inner wall surface of the through-hole, whereby a circuit can efficiently be formed, and when it is at least the lower limit value, the connection reliability of the wiring substrate will be excellent, and electrical characteristics will improve by a decrease of the dielectric constant and a decrease of the dielectric dissipation factor of the layer by a resin powder.

The linear expansion coefficient of the electrical insulator layer is preferably from 0 to 100 ppm/° C., more preferably from 0 to 80 ppm/° C., further preferably from 0 to 70 ppm/° C. When the linear expansion coefficient is at most the upper limit value of the above range, the difference in the linear expansion coefficient with the conductor layer tends to be small, and deformation such as warpage on the wiring substrate tends to be suppressed. The linear expansion coefficient is obtained by the method disclosed in Examples.

The average particle size of the resin powder in the electrical insulator layer is preferably from 1 to 7 μm, more preferably from 1 to 5 μm, further preferably from 1 to 3 μm. Within such a range, the resin powder will not agglomerate in the electrical insulator layer and has favorable dispersibility, and when plating is formed on a cross-section having a through-hole formed, formation failure and peeling of the plating layer are less likely to occur. Further, cracking on the plating layer due to thermal expansion of the electrical insulator layer accompanying temperature changes, an increase of the electrical resistance of a wiring substrate due to peeling of the plating layer, and disconnection are less likely to occur. The average particle size of the resin powder in the electrical insulator layer is an average value calculated by measuring diameters of 100 powder particles using a scanning electron microscope (manufactured by Hitachi High-Technologies Corporation, model: S-4800) with a magnification of 5,000. As the diameter of a particle, a long side is measured and taken as the diameter. In a case where particles are agglomerated, the diameter of the agglomerate regarded as one particle is measured.

In a case where the wiring substrate is a flexible circuit board, the thickness of the electrical insulator layer is preferably from 4 to 1,000 μm, more preferably from 6 to 300 μm per layer. When the thickness is at least the lower limit value of the above range, the wiring substrate will not excessively be deformed, whereby the conductor layer is hardly disconnected. The thickness being at most the upper limit value of the above range will contribute to excellent flexibility, and downsizing and weight saving of the wiring substrate.

In a case where the wiring substrate is a rigid circuit board, the thickness of the electrical insulator layer is preferably from 4 to 3,000 μm, more preferably from 6 to 2,000 μm per layer. When the thickness is at least the lower limit value of the above range, the wiring substrate will not excessively be deformed, whereby the conductor layer is hardly disconnected. The thickness being at most the upper limit value of the above range will contribute to downsizing and weight saving of the wiring substrate.

<Heat Resistant Resin Layer>

The heat resistant resin layer contains a heat resistant resin and a resin powder.

The heat resistant resin layer may contain, as the case requires, a reinforcing fiber substrate, and as the case requires, may contain a component other than the heat resistant resin, the resin powder and the reinforcing fiber substrate.

In a case where the wiring substrate is a flexible circuit board, the thickness of the heat resistant resin layer is preferably from 3 to 500 μm, more preferably from 5 to 300 μm, further preferably from 6 to 200 μm per layer. When the thickness is at least the lower limit value of the above range, excellent electrical insulating property will be obtained, and deformation such as warpage is likely to be suppressed. When the thickness is at most the upper limit value of the above range, the entire wiring substrate can be made thin.

In a case where the wiring substrate is a rigid circuit board, the thickness of the heat resistant resin layer is preferably from 12 to 3,000 μm, more preferably from 25 to 1,000 μm per layer. When the thickness is at least the lower limit value of the above range, electrical insulating property will be excellent, and deformation such as warpage is likely to be suppressed. When the thickness is at most the upper limit value of the above range, the entire wiring substrate can be made thin.

(Heat Resistant Resin)

The heat resistant resin (excluding the after-mentioned resin (X)) is a component which imparts heat resistance to the heat resistant resin layer. Further, it is a component which decreases the linear expansion coefficient of the electrical insulator layer.

The heat resistant resin may, for example, be a polyimide (such as an aromatic polyimide), a polyarylate, a polysulfone, a polyarylsulfone (such as a polyethersulfone), an aromatic polyamide, an aromatic polyetheramide, a polyphenylene sulfide, a polyallyl ether ketone, a polyamideimide, a liquid crystalline polyester, or a cured product of other thermosetting resin (such as an epoxy resin, an acrylic resin, an unsaturated polyester resin or a phenol resin). The heat resistant resin may be used alone or in combination of two or more.

In a case where the wiring substrate is a flexible circuit board, the heat resistant resin is preferably a polyimide or a liquid crystalline polyester. In view of heat resistance, a polyimide is preferred. In view of electrical characteristics, a liquid crystalline polyester is preferred.

In a case where the wiring substrate is a rigid circuit board, the heat resistant resin is preferably a cured product of an epoxy resin.

The polyimide may be a thermosetting polyimide or may be a thermoplastic polyimide. The polyimide is preferably an aromatic polyimide. The aromatic polyimide is preferably a wholly aromatic polyimide produced by condensation polymerization of an aromatic polycarboxylic dianhydride and an aromatic diamine.

A polyimide is usually obtained by reaction (polycondensation) of a polycarboxylic dianhydride (or its derivative) and a diamine via a polyamic acid (polyimide precursor).

A polyimide, particularly an aromatic polyimide, is insoluble in a solvent or the like and is infusible due to its stiff main chain structure. Accordingly, first, a polyimide precursor (polyamic acid or polyamide acid) soluble in an organic solvent is prepared by a reaction of a polycarboxylic dianhydride and a diamine, and processing is conducted by various methods at a stage of the polyamic acid. Then, the polyamic acid is dehydrated by heating or by a chemical method to be cyclized (imidized) to be formed into a polyimide.

As specific examples of the aromatic polycarboxylic dianhydride, ones disclosed in JP-A-2012-145676, paragraph [0055] may be mentioned. The polycarboxylic dianhydrides may be used alone or in combination of two or more.

As specific examples of the aromatic diamine, ones disclosed in JP-A-2012-145676, paragraph [0057] may be mentioned. The aromatic diamines may be used alone or in combination of two or more.

The liquid crystalline polyester is preferably a liquid crystalline polyester having a melting point of at least 300° C., a dielectric constant of at most 3.2 and a dielectric dissipation factor of at most 0.005 in view of heat resistance. As commercially available liquid crystalline polyester, VECSTAR (tradename, manufactured by KURARAY CO., LTD.), BIAC (tradename, manufactured by W.L. Gore & Associates Co., Ltd.) may, for example, be mentioned.

The epoxy resin may, for example, be a cresol novolac epoxy resin, a bisphenol A epoxy resin, a bisphenol F epoxy resin, a phenol novolac epoxy resin, an alkylphenol novolac epoxy resin, a bisphenol F epoxy resin, a naphthalene epoxy resin, a dicyclopentadiene epoxy resin, an epoxidized product of a condensate of a phenol and an aromatic aldehyde having a phenolic hydroxy group, triglycidyl isocyanurate or an alicyclic epoxy resin.

(Resin Powder)

The resin powder is a component which imparts excellent transmission characteristics to the wiring substrate.

The resin powder is formed from a resin material containing the after-described resin (X). The resin material may contain, as the case requires, a resin other than the resin (X) (hereinafter referred to as resin (Y)), an additive, etc.

The average particle size of the resin powder added to the heat resistant resin layer is preferably from 0.02 to 200 μm, more preferably from 0.02 to 5 μm. When the average particle size is at least the lower limit value of the above range, the resin powder has sufficient flowability and is easily handled. When the average particle size of the resin powder is at most the upper limit value of the above range, the filling rate of the resin powder in the heat resistant resin layer can be made high. The higher the filling rate, the more excellent the transmission characteristics of the wiring substrate. Further, when the average particle size is at most the upper limit value of the above range, the heat resistant resin layer can be made thin.

The average particle size of the resin powder added to the heat resistant resin layer is a volume-based accumulative 50% size ($D_{50}$) measured by a laser diffraction/scattering method. That is, it is a particle size at a point where the accumulative volume is 50% on an accumulative curve which is obtained by measuring the particle size distribution by a laser diffraction/scattering method and taking the whole volume of the group of particles to be 100%.

The volume-based accumulative 90% size ($D_{90}$) of the resin powder added to the heat resistant resin layer is preferably at most 8 μm, more preferably at most 6 μm, further preferably from 1.5 to 5 μm. When $D_{90}$ is at most the upper limit value of the above range, surface roughness of the heat resistant resin layer tends to be suppressed, and excellent transmission characteristics will be obtained.

$D_{90}$ of the resin powder is obtained by a laser diffraction/scattering method. That is, it is a particle size at a point where the accumulative volume is 90% on an accumulative curve which is obtained by measuring the particle size distribution by a laser diffraction/scattering method and taking the whole volume of the group of particles to be 100%.

The fluororesin contained in the resin material constituting the resin powder (hereinafter referred to as resin (X)) is a melt-formable fluororesin having at least one type of functional group selected from the group consisting of a carbonyl group-containing group, a hydroxy group, an epoxy group and an isocyanate group (hereinafter these functional groups will sometimes generally be referred to as "functional group (G)").

The resin (X) is a component which imparts excellent transmission characteristics to the wiring substrate and which imparts lyophilicity and adhesion to a plating layer, to the inner wall surface of the hole after the pre-treatment in the wiring substrate.

The resin (X) preferably has, as the functional group (G), at least a carbonyl group-containing group, in view of more excellent lyophilicity of the inner wall surface of the hole after the pre-treatment in the wiring substrate and more excellent adhesion between the inner wall surface of the hole after the pre-treatment and the plating layer in the wiring substrate.

The carbonyl group-containing group may, for example, be a group having a carbonyl group between carbon atoms in a hydrocarbon group, a carbonate group, a carboxy group, a haloformyl group, an alkoxycarbonyl group, an acid anhydride residue, a polyfluoroalkoxycarbonyl group or a fatty acid residue. In view of more excellent lyophilicity of the inner wall surface of the hole after the pre-treatment in the wiring substrate and more excellent adhesion between the inner wall surface of the hole after the pre-treatment and the plating layer in the wiring substrate, the carbonyl group-containing group is preferably at least one type selected from the group consisting of a group having a carbonyl group between carbon atoms in a hydrocarbon group, a carbonate group, a carboxy group, a haloformyl group, an alkoxycarbonyl group and an acid anhydride residue, more preferably either one or both of a carboxy group and an acid anhydride residue.

In the group having a carbonyl group between carbon atoms in a hydrocarbon group, the hydrocarbon group may, for example, be a $C_{2-8}$ alkylene group. The number of carbon atoms in the alkylene group is a number of carbon atoms in a state not including the carbonyl group. The alkylene group may be linear or branched.

The haloformyl group is represented by —C(=O)—X (wherein X is a halogen atom). The halogen atom in the haloformyl group may, for example, be a fluorine atom or a chlorine atom and is preferably a fluorine atom.

The alkoxy group in the alkoxycarbonyl group may be linear or branched, and is preferably a $C_{1-8}$ alkoxy group, particularly preferably a methoxy group or an ethoxy group.

The content of the functional groups (G) in the resin (X) is preferably from 10 to 60,000 groups, more preferably from 100 to 50,000 groups, further preferably from 100 to 10,000 groups, particularly preferably from 300 to 5,000 groups per $1 \times 10^6$ carbon atoms in the main chain of the resin (X). When the content is within the above range, lyophilicity of the inner wall surface of the hole after the pre-treatment in the wiring substrate will be more excellent. Further, the adhesion between the inner wall surface of the hole after the pre-treatment and the plating layer in the wiring substrate will be more excellent.

The content of the functional groups (G) may be measured by e.g. nuclear magnetic resonance (NMR) analysis or infrared absorption spectrum analysis. For example, the content (mol %) of units having the functional groups (G) based on all the units constituting the fluororesin (X) is determined by e.g. infrared absorption spectrum analysis as disclosed in e.g. JP-A-2007-314720, and the content of the functional groups (G) can be calculated from the content.

The melting point of the resin (X) is preferably at least 260° C., more preferably from 260 to 320° C., further preferably from 295 to 315° C., particularly preferably from 295 to 310° C. When the melting point is at least the lower limit value of the above range, the heat resistant resin layer will be excellent in the heat resistance. When the melting point is at most the upper limit value of the above range, the resin (X) is excellent in the forming property. The melting point of the resin (X) may be adjusted e.g. by the type or the content of units constituting the resin (X), the molecular weight of the resin (X), etc.

As the resin (X), a melt-formable resin is used, whereby the resin powder will easily be produced.

The melt-formable resin (X) may, for example, be a fluororesin having the functional groups (G) introduced to a known melt-formable fluororesin (such as a tetrafluoroethylene/fluoroalkyl vinyl ether copolymer, a tetrafluoroethylene/hexafluoropropylene copolymer (FEP), an ethylene/tetrafluoroethylene copolymer (ETFE), polyvinylidene fluoride (PVDF), polychlorotrifluoroethylene (PCTFE) or an ethylene/chlorotrifluoroethylene copolymer (ECTFE)); or the after-described fluorinated copolymer (X1). The resin (X) is, in view of the heat resistance of the heat resistant resin layer, preferably a fluororesin having the functional group (G) introduced to a perfluoropolymer such as a tetrafluoroethylene/perfluoro(alkyl vinyl ether) copolymer (PFA) or FEP, or the after-described fluorinated copolymer (X1).

As the resin (X), a resin is used such that a temperature at which the melt flow rate is preferably from 0.1 to 1,000 g/10 min, more preferably from 0.5 to 100 g/10 min, further preferably from 1 to 30 g/10 min, particularly preferably from 5 to 20 g/10 min, is present, at a temperature higher by at least 20° C. than the melting point of the resin (X), under a load of 49 N. When the melt flow rate is at least the lower limit value of the above range, the resin (X) is excellent in the forming property. When the melt flow rate is at most the upper limit value of the above range, heat resistant resin layer will be more excellent in the heat resistance.

The melt flow rate of the resin (X) may be adjusted by conditions for producing the resin (X). For example, by shortening the polymerization time at the time of polymerization, the melt flow rate of the resin (X) tends to be high. Further, by reducing the amount of the radical polymerization initiator used at the time of production, the melt flow rate of the resin (X) tends to be low.

The dielectric constant of the resin (X) is preferably from 2.0 to 3.2, more preferably from 2.0 to 3.0. The lower the dielectric constant, the more the dielectric constant of the electrical insulator layer can be lowered.

The dielectric constant of the resin (X) is measured by transformer bridge method in accordance with ASTM D150, in an environment at a temperature of 23° C.±2° C. under a relative humidity of 50%±5% RH, at a frequency of 1 MHz.

The dielectric constant of the resin (X) may be adjusted by the content of fluorine atoms in the resin (X). For example, the higher the content of the TFE units in the after-described fluorinated copolymer (X1), the lower the dielectric constant of the resin (X) tends to be.

The resin (X) is preferably a fluorinated copolymer (X1) having units having a functional group (G) (hereinafter referred to as units (1)), and units derived from tetrafluoroethylene (TFE) (hereinafter referred to as TFE units, the same applies to other units) (hereinafter referred to as copolymer (X1)), in view of more excellent lyophilicity of the inner wall surface of the hole after the pre-treatment in the wiring substrate, more excellent adhesion between the inner wall surface of the hole after the pre-treatment and the plating layer in the wiring substrate, and more excellent heat resistance of the heat resistant resin layer.

The copolymer (X1) may further have, as the case requires, units other than the units (1) and the TFE units.

The units (1) may, for example, be units derived from a monomer having a carbonyl group-containing group; units derived from a monomer having a hydroxy group; units derived from a monomer having an epoxy group; or units derived from a monomer having an isocyanate group.

The monomer having a carbonyl group-containing group may, for example, be an unsaturated dicarboxylic acid anhydride which is a compound having an acid anhydride residue and a polymerizable carbon-carbon double bond, a monomer having a carboxy group (such as itaconic acid or acrylic acid), a vinyl ester (such as vinyl acetate), a methacrylate or an acrylate (such as a (polyfluoroalkyl)acrylate), or $CF_2=CFOR^{f1}CO_2X^1$ (wherein $R^{f1}$ is a $C_{1-10}$ perfluoroalkylene group which may contain an etheric oxygen atom, and $X^1$ is a hydrogen atom or a $C_{1-3}$ alkyl group).

The unsaturated dicarboxylic acid anhydride may, for example, be itaconic anhydride (IAH), citraconic anhydride (CAH), 5-norbornen-2,3-dicarboxylic anhydride (NAH) or maleic anhydride.

The monomer having a hydroxy group may, for example, be a vinyl ester, a vinyl ether or an allyl ether.

The monomer having an epoxy group may, for example, be allyl glycidyl ether, 2-methyl allyl glycidyl ether, glycidyl acrylate or glycidyl methacrylate.

The monomer having an isocyanate group may, for example, be 2-acryloyloxyethyl isocyanate, 2-(2-acryloyloxyethoxy)ethyl isocyanate, 2-methacryloyloxyethyl isocyanate or 2-(2-methacryloyloxyethoxy)ethyl isocyanate.

The unit (1) may have one functional group (G) or may have two or more functional groups (G). In a case where the unit (1) has two or more functional groups (G), these functional groups (G) may be the same or different.

The units (1) are preferably ones having as the functional group (G) at least a carbonyl group-containing group, in view of more excellent lyophilicity of the inner wall surface of the hole after the pre-treatment in the wiring substrate, and more excellent adhesion between the inner wall surface of the hole after the pre-treatment and the plating layer in the wiring substrate. Further, the units (1) are more preferably at least one type selected from the group consisting of units derived from IAH, units derived from CAH and units derived from NAH, particularly preferably units derived from NAH, in view of excellent thermal stability, more excellent lyophilicity of the inner wall surface of the hole after the pre-treatment in the wiring substrate, and more excellent adhesion between the inner wall surface of the hole after the pre-treatment and the plating layer in the wiring substrate.

Other units may, for example, be units derived from other monomer such as a perfluoro(alkyl vinyl ether) (PAVE), hexafluoropropylene (HFP), vinyl fluoride, vinylidene fluoride (VdF), trifluoroethylene or chlorotrifluoroethylene (CTFE), preferably PAVE.

PAVE may, for example, be $CF_2=CFOCF_3$, $CF_2=CFOCF_2CF_3$, $CF_2=CFOCF_2CF_2CF_3$ (PPVE), $CF_2=CFOCF_2CF_2CF_2CF_3$ or $CF_2=CFO(CF_2)_8F$, and is preferably PPVE.

The copolymer (X1) is preferably a TFE/PPVE/NAH copolymer, a TFE/PPVE/IAH copolymer or a TFE/PPVE/CAH copolymer, in view of more excellent lyophilicity of the inner wall surface of the hole after the pre-treatment in the wiring substrate and more excellent adhesion between the inner wall surface of the hole after the pre-treatment and the plating layer in the wiring substrate.

The resin (Y) is preferably one which does not impair the effects of the present invention and may, for example, be a fluororesin other than the resin (X), an aromatic polyester, a polyamideimide or a thermoplastic polyimide. The resin (Y) is preferably another fluororesin in view of transmission characteristics of the wiring substrate. The resin (Y) may be used alone or in combination of two or more.

Other fluororesin may, for example, be PTFE, a tetrafluoroethylene/fluoroalkyl vinyl ether copolymer (excluding the copolymer (X1)), FEP (excluding the copolymer (X1)) or ETFE. Other fluorinated copolymer is preferably one having a melting point of at least 280° C. in view of heat resistance.

The additive contained in the resin material constituting the resin powder is preferably one which does not impair the effects of the present invention and may, for example, be an inorganic filler, polyphenylene ether (PPE), polyphenylene oxide (PPO) or a rubber, which has a low dielectric constant and a low dielectric dissipation factor.

The resin material constituting the resin powder preferably contains the resin (X) as the main component. When the resin material contains the resin (X) as the main component, lyophilicity of the inner wall surface of the hole after the pre-treatment in the wiring substrate will be more excellent, and the adhesion between the inner wall surface of the hole after the pre-treatment and the plating layer in the wiring substrate will be more excellent. Here, the resin material "containing the resin (X) as the main component" means that the proportion of the resin (X) based on the entire amount of the resin material is at least 80 mass %. The proportion of the resin (X) based on the entire amount of the resin material is preferably at least 85 mass %, more preferably at least 90 mass %, particularly preferably 100 mass %.

As a method for producing the resin powder, a method of pulverizing the resin material containing the resin (X), followed by classification (such as sieving) may be mentioned.

In a case where the resin (X) is produced by solution polymerization, suspension polymerization or emulsion polymerization, the resin (X) in the form of particles recovered after removing the organic solvent or the aqueous medium used for polymerization may be used as it is, or the recovered resin (X) in the form of particles is pulverized, followed by classification to obtain a resin powder having a desired particle size.

In a case where the resin material contains the resin (Y), it is preferred that the resin (X) and the resin (Y) are melt-mixed, then pulverized and classified.

As a method for pulverizing and a method for classifying the resin material, the method disclosed in WO2016/017801, paragraphs [0065] to [0069] may be employed.

The reinforcing fiber substrate contained in the heat resistant resin layer is a component which imparts sufficient dimensional accuracy and mechanical strength to the heat resistant resin layer.

As a form of the reinforcing fiber substrate, woven fabric or non-woven fabric may be mentioned. The reinforcing fiber substrate is preferably woven fabric, particularly preferably glass cloth.

As reinforcing fibers constituting the reinforcing fiber substrate, glass fibers or carbon fibers may, for example, be mentioned, and glass fibers are preferred.

As the material of the glass fibers, E-glass, C-glass, A-glass, S-glass, D-glass, NE-glass, T-glass, quartz, low dielectric constant glass or high dielectric constant glass may, for example, be mentioned, and among them, in view of availability, E-glass, S-glass, T-glass or NE-glass is preferred.

The glass fibers may be surface-treated with a known surface treating agent such as a silane coupling agent, whereby the adhesion to the heat resistant resin will improve, and mechanical strength, heat resistance and through-hole reliability will improve.

The glass fibers may be surface-treated with a known surface treating agent such as a silane coupling agent, whereby the adhesion to the heat resistant resin will improve, and mechanical strength, heat resistance and through-hole reliability will improve.

As other component contained in the heat resistant resin layer, an additive may, for example, be mentioned.

The additive is preferably an inorganic filler having a low dielectric constant and a low dielectric dissipation factor.

The inorganic filler may, for example, be silica, clay, talc, calcium carbonate, mica, diatomaceous earth, alumina, zinc oxide, titanium oxide, calcium oxide, magnesium oxide, iron oxide, tin oxide, antimony oxide, calcium hydroxide, magnesium hydroxide, aluminum hydroxide, basic magnesium carbonate, magnesium carbonate, zinc carbonate, barium carbonate, dawsonite, hydrotalcite, calcium sulfate, barium sulfate, calcium silicate, montmorillonite, bentonite, activated clay, sepiolite, Imogolite, sericite, glass fibers, glass beads, silica balloons, carbon black, carbon nanotubes, carbon nanohorns, graphite, carbon fibers, glass balloons, carbon balloons, wood flour or zinc borate.

The inorganic filler may be porous or non-porous. The inorganic filler is preferably porous in view of a lower dielectric constant and a lower dielectric dissipation factor.

The inorganic filler may be used alone or in combination of two or more.

In a case where the wiring substrate is a flexible circuit board, preferred proportions of the respective components in the heat resistant resin layer are as follows.

The content of the heat resistant resin is preferably from 30 to 90 mass %, more preferably from 35 to 80 mass %, further preferably from 40 to 70 mass %, in the heat resistant resin layer. When the proportion of the heat resistant resin is at least the lower limit value of the above range, the heat resistant resin layer will be more excellent in the heat resistance. When the proportion of the heat resistant resin is at most the upper limit value of the above range, the effects by the resin powder will hardly be impaired.

The content of the resin powder is from 5 to 70 mass %, preferably from 10 to 65 mass % in the heat resistant resin layer. When the content is at least the lower limit value of the above range, the wiring substrate will be excellent in transmission characteristics. When the content is at most the upper limit value of the above range, lyophilicity of the inner wall surface of the hole after the pre-treatment in the wiring substrate will be excellent. Further, adhesion between the inner wall surface of the hole after the pre-treatment and the plating layer in the wiring substrate will be excellent.

The content of other component is preferably from 0 to 65 mass %, more preferably from 0 to 55 mass % in the heat resistant resin layer. When the content is at most the upper limit value of the above range, effects by the heat resistant resin and effects by the resin powder are less likely to be impaired.

In a case where the wiring substrate is a rigid circuit board, preferred proportions of the respective components in the heat resistant resin layer are as follows.

The content of the heat resistant resin is preferably from 25 to 90 mass %, more preferably from 30 to 80 mass % in the heat resistant resin layer. When the content is at least the lower limit value of the above range, the heat resistant resin layer will be more excellent in the heat resistance. When the content is at most the upper limit value of the above range, effects by the resin powder and effects by the reinforcing fiber substrate are less likely to be impaired.

The content of the resin powder is from 5 to 70 mass %, preferably from 10 to 65 mass %, more preferably from 20 to 60 mass % in the heat resistant resin layer. When the content is at least the lower limit value of the above range, the wiring substrate will be excellent in transmission characteristics. When the content is at most the upper limit value of the above range, lyophilicity of the inner wall surface of the hole after the pre-treatment in the wiring substrate will be excellent. Further, adhesion between the inner wall surface of the hole after the pre-treatment and the plating layer in the wiring substrate will be excellent.

The content of the reinforcing fiber substrate is preferably from 5 to 70 mass %, more preferably from 5 to 60 mass % in the heat resistant resin layer. When the content is at least the lower limit value of the above range, the heat resistant resin layer will be excellent in dimensional accuracy and mechanical strength. When the content is at most the upper limit value of the above range, effects by the heat resistant resin and effects by the resin powder are less likely to be impaired.

The content of other component is preferably from 0 to 65 mass %, more preferably from 0 to 55 mass % in the heat resistant resin layer. When the content is at most the upper limit value of the above range, effects by the heat resistant resin, effects by the resin powder and the effects by the reinforcing fiber substrate are less likely to be impaired.

The conductor layer may, for example, be a layer formed of a metal foil or a layer formed by plating. As the conductor layer, a layer formed of a metal foil having a low resistance is preferred. The metal foil may be a foil made of a metal such as copper, silver, gold or aluminum. The metal may be used alone or in combination of two or more. In a case where two or more metals are used in combination, the metal foil is preferably a metal foil having metal plating applied thereto, particularly preferably a copper foil having gold plating applied thereto.

The thickness of the conductor layer is preferably from 0.1 to 100 μm, more preferably from 1 to 50 μm, particularly preferably from 1 to 40 μm, per layer.

With respect to the conductor layer, the surface on the electrical insulator layer side may be roughened, with a view to reducing the skin effect when transmitting signals in a high frequency band. On the surface opposite from the roughened surface of the conductor layer, an anti-corrosive oxide coating of e.g. chromate may be formed.

The conductor layer may have a wiring formed by pattern forming as the case requires. Further, the conductor layer may have a form other than a wiring.

The hole formed in the wiring substrate is not limited so long as it opens at least from the first conductor layer through the second conductor layer, and it does not necessarily penetrate from the first surface through the second surface of the wiring substrate. For example, the hole formed in the wiring substrate does not necessarily penetrate the first conductor layer or the second conductor layer.

The plating layer is not limited so long as conduction between the first conductor layer and the second conductor layer is secured through the plating layer. The plating layer may, for example, be a copper plating layer, a gold plating layer, a nickel plating layer, a chromium plating layer, a zinc plating layer or a tin plating layer, and is preferably a copper plating layer.

The adhesive layer is a layer which improves adhesion between the heat resistant resin layer and the conductor layer.

The adhesive layer contains an adhesive material or its cured product. The adhesive layer may contain, as the case requires, a reinforcing fiber substrate or other component.

The adhesive material may, for example, be a thermoplastic polyimide, a thermosetting composition (such as an epoxy resin or an acrylic resin) or the above-described resin (X).

As the application of the wiring substrate of the present invention, preferred is an antenna wherein the first conductor layer and the second conductor layer are wiring, and the electrical conductor layer is an antenna element layer. The application of the wiring substrate of the present invention is not limited to an antenna. The wiring substrate may be used as a printed wiring board for forming a high frequency circuit of e.g. a communication device or a sensor.

The wiring substrate is useful also as a substrate for electronic equipment such as radar, a network router, a backplane or a wireless infrastructure for which high frequency characteristics are required, or a substrate for various sensors or a substrate for engine management sensors for automobiles, and is particularly useful for an application for which a reduction in the transmission loss in a millimeter wave band is required.

The above-described wiring substrate of the present invention has excellent transmission characteristics, since the heat resistant resin layer of the electrical insulator layer contains a resin powder formed from a resin material containing a fluororesin, the content of the resin powder is at least 5 mass % in the heat resistant resin layer, and the dielectric constant of the electrical insulator layer is from 2.0 to 3.5.

Further, in the above-described wiring substrate of the present invention, the inner wall surface of a hole is less likely to repel a plating liquid regardless of the type of the pre-treatment applied to the inner wall surface of the hole in the heat resistant layer, since the fluororesin contained in the resin material constituting the resin powder is a melt-formable fluororesin having functional groups (G), that is, a fluororesin having high lyophilicity, and the content of the resin powder is at most 70 mass % in the heat resistant resin layer. Accordingly, a plating layer is sufficiently formed on the inner wall surface of the hole, and initial failure of the plating layer formed on the inner wall surface of the hole is suppressed.

Further, in the above-described wiring substrate of the present invention, adhesion between the inner wall surface of the hole in the heat resistant resin layer and the plating layer is excellent regardless of the type of the pre-treatment applied to the inner wall surface of the hole in the heat resistant resin layer, since the fluororesin contained in the resin material constituting the resin powder is a melt-formable fluororesin having functional groups (G), that is, a fluororesin excellent in adhesion, and the content of the resin powder is at most 70 mass % in the heat resistant resin layer. Accordingly, conduction failure is less likely to occur in the plating layer even after repeated temperature changes, and favorable heat resistance of the plating layer is obtained.

«Process for Producing Wiring Substrate»

The process for producing a wiring substrate of the present invention is roughly classified into the following process (a) and process (b) depending upon whether a laminate on which hole processing is to be conducted has the first conductor layer or not.

Process (a): A process of conducting hole processing on a laminate having a first conductor layer.

Process (b): A process of conducting hole processing on a laminate having no first conductor layer.

Now, the process (a) and the process (b) will be respectively described.

<Process (a)>

The process (a) has the following steps (a1) to (a3).

Step (a1): A step of forming, in a laminate comprising the first conductor layer, the electrical insulator layer and the second conductor layer laminated in this order, a hole which opens at least from the first conductor layer through the second conductor layer.

Step (a2): A step of applying a pre-treatment to the inner wall surface of the hole after the step (a1).

Step (a3): A step of forming a plating layer on the inner wall surface of the hole having the pre-treatment applied thereto, after the step (a2).

(Step (a1))

The laminate may be produced, for example, by the following method.

A first metal foil, a resin film containing the heat resistant resin and resin powder, and a second metal foil are laminated in this order and heat-pressed.

A liquid composition containing the heat resistant resin, the resin powder and a liquid medium is prepared. The liquid composition is applied to the surface of a first metal foil and dried to obtain a metal foil with an electrical insulator layer. The metal foil with an electrical insulator layer and a second metal foil are laminated so that the electrical insulator layer and the second metal foil are in contact with each other, and heat-pressed.

On the surface of the electrical insulator layer of the metal foil with an electrical insulator layer obtained by the above method, a conductor layer is formed by electroless plating method.

The hole is formed so that it opens at least from the first conductor layer through the second conductor layer. That is, the hole is formed so that it penetrates at least the electrical insulator layer positioned between the first conductor layer and the second conductor layer. In a case where the hole is formed from the first conductor layer side of the electrical insulator layer, so long as the first conductor layer and the second conductor layer are connected by the hole, the hole may or may not reach the interior of the second conductor layer. In a case where the hole is formed from the second conductor layer side of the electrical insulator layer, so long as the first conductor layer and the second conductor layer are connected by the hole, the hole may or may not reach the interior of the first conductor layer.

The method of forming the hole in the laminate is not particularly limited, and a method of forming a hole by laser irradiation or a method of forming a hole by a drill may, for example, be mentioned.

The diameter of the hole formed in the laminate is not particularly limited and may properly be determined.

(Step (a2))

As the pre-treatment, a treatment with a permanganic acid solution, a plasma treatment or an etching treatment with metal sodium may, for example, be mentioned. In the present invention, sufficient lyophilicity and adhesion to the plating layer can be imparted to the inner wall surface of the hole in the wiring substrate, by a treatment with a permanganic acid solution or a plasma treatment, and accordingly an etching treatment with metal sodium having many problems is not necessary.

In a case where both of the treatment with a permanganic acid solution and a plasma treatment are conducted as the pre-treatment, it is preferred to conduct the treatment with a permanganic acid solution first in view of removability of smear (resin residue) which forms at the time of forming the hole, and in that the plating layer is likely to be formed on the entire inner wall surface of the hole and the adhesion between the inner wall surface of the hole and the plating layer will sufficiently be secured. However, the treatment with a permanganic acid solution may be conducted after the plasma treatment.

(Step (a3))

As a method of forming the plating layer on the inner wall surface of the hole after the pre-treatment, electroless plating may, for example, be mentioned.

Now, an example of the process (a) will be described.

Figure 3A:
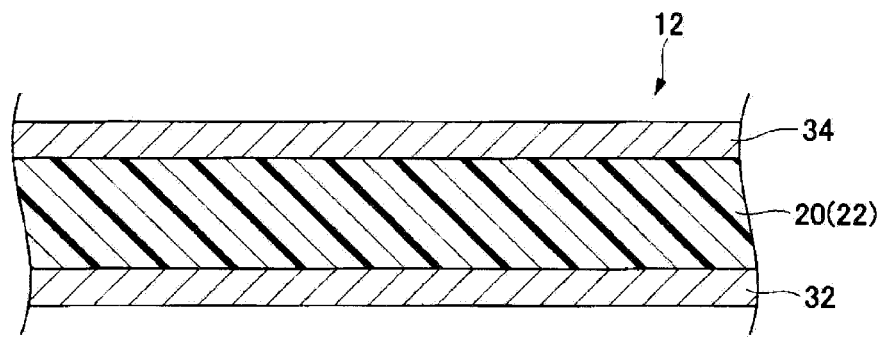
FIG. 3a is a cross-sectional view schematically illustrating an example of a laminate used for a process for producing a wiring substrate of the present invention.
Figure 3B:
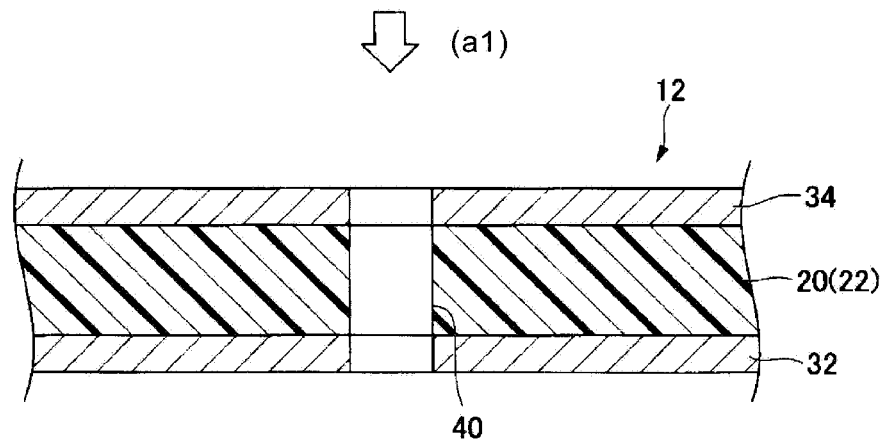
Figure 3C:
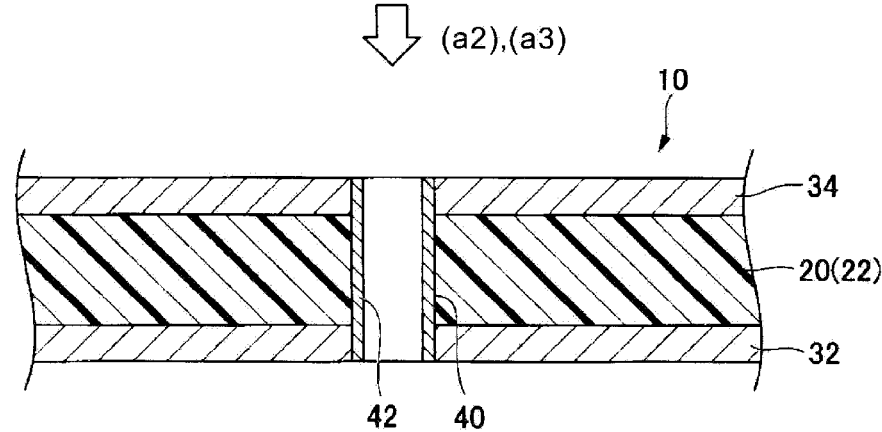
FIG. 3c is a cross-sectional view schematically illustrating a step of forming a plating layer on the inner wall surface of the hole in the laminate shown in FIG. 3b.

As shown in FIG. 3a, a laminate 12 having a first conductor layer 32, an electrical insulator layer 20 and a second conductor layer 34 laminated in this order is prepared. As shown in FIG. 3b, in the laminate 12, a hole 40 which penetrates from the first conductor layer 32 through the second conductor layer 34 is formed (step (a1)). As shown in FIG. 3c, a pre-treatment is applied to the inner wall surface of the hole 40, and e.g. electroless plating is applied to the inner wall surface of the hole 40 to form a plating layer 42, thereby to obtain a wiring substrate 10 (step (a2) and step (a3)).

<Process (b)>

The process (b) has the following steps (b1) to (b4).

Step (b1): A step of forming, in a laminate having a first conductor layer laminated on a first surface of an electrical insulator layer, a hole which opens at least from a second surface of the electrical insulator layer through the first conductor layer.

Step (b2): A step of applying a pre-treatment to the inner wall surface of the hole after the step (b1).

Step (b3): A step of forming a plating layer on the inner wall surface of the hole having the pre-treatment applied thereto, after the step (b2).

Step (b4): A step of forming a second conductor layer on the second surface of the electrical insulator layer.

(Step (b1))

The step (b1) may be carried out in the same manner as in the step (a1) except for production of the laminate.

The laminate may be produced, for example, by the following method.

A first metal foil, and a resin film containing the heat resistant resin and the resin powder are laminated in this order and heat-pressed.

A liquid composition containing the heat resistant resin, the resin powder and a liquid medium is prepared. The liquid composition is applied to the surface of a first metal foil and dried to obtain a laminate.

(Step (b2) and Step (b3))

The step (b2) and the step (b3) may be carried out in the same manner as the step (a2) and the step (a3) except that the laminate obtained in the step (b1) is used.

(Step (b4))

As a method of forming the second conductor layer on the second surface of the electrical insulator layer, electroless plating may, for example, be mentioned. Further, as the case requires, a pattern may be formed on the second conductor layer by etching.

The step (b4) may be carried out before the step (b3), may be carried out after the step (b3), or may be carried out simultaneously with the step (b3).

Now, an example of the process (b) will be described.

As shown in FIG. 4a, a laminate 14 having a first conductor layer 32 and an electrical insulator layer 20 laminated in this order is prepared. As shown in FIG. 4b, a hole 40 which penetrates from the electrical insulator layer 20 through the first conductor layer 32 is formed in the laminate 14 (Step (b1)). As shown in FIG. 4c, a pre-treatment is applied to the inner wall surface of the hole 40, and e.g. electroless plating is conducted on the inner wall surface of the hole 40 to form a plating layer 42 (step (b2) and step (b3)). E.g. electroless plating is conducted on a second surface of the electrical insulator layer 20 to form a second conductor layer 34, thereby to obtain a wiring substrate 10 (step (b4)).

According to the above-described process for producing a wiring substrate of the present invention, a wiring substrate having excellent transmission characteristics can be produced, since the heat resistant resin layer of the electrical insulator layer contains a resin powder formed from a resin material containing a fluororesin, the content of the resin powder is at least 5 mass % in the heat resistant resin layer, and the dielectric constant of the electrical insulator layer is from 2.0 to 3.5.

Further, according to the process for producing a wiring substrate of the present invention, the inner wall surface of a hole is less likely to repel a plating liquid regardless of the type of the pre-treatment applied to the inner wall surface of the hole in the heat resistant resin layer, since the fluororesin contained in the resin material constituting the resin powder is a melt-formable fluororesin having functional groups (G), that is, a fluororesin having high lyophilicity, and the content of the resin powder is at most 70 mass % in the heat resistant resin layer. Accordingly, the plating layer is sufficiently formed on the inner wall surface of the hole, and a plating layer having initial failure suppressed can be formed on the inner wall surface of the hole.

Further, according to the above-described process for producing a wiring substrate of the present invention, adhesion between the inner wall surface of a hole in the heat resistant resin layer and the plating layer is excellent regardless of the type of the pre-treatment applied to the inner wall surface of the hole in the heat resistant resin layer, since the fluororesin contained in the resin material constituting the resin powder is a melt-formable fluororesin having functional groups (G), that is, a fluororesin excellent in adhesion, and the content of the resin powder is at most 70 mass % in the heat resistant resin layer. Accordingly, a plating layer having favorable heat resistance, which is less likely to have conduction failure even after repeated temperature changes, can be formed on the inner wall surface of the hole.

EXAMPLES

Now, the present invention will be described in further detail with reference to Examples. However, it should be understood that the present invention is by no means restricted thereto.

(Proportion of Units)

The contents of the units in the resin (X) were obtained as follows.

The content (mol %) of units derived from NAH was obtained by the following infrared absorption spectrum analysis.

The resin (X) was press-formed to obtain a 200 μm film, which was subjected to infrared absorption spectrum analysis. In the obtained infrared absorption spectrum, the absorbance of an absorption peak at 1,778 $cm^{-1}$ which is an absorption peak of the units derived from NAH was measured. The absorbance was divided by the NAH molar absorption coefficient 20,810 $mol^{-1} \cdot cm^{-1}$ to obtain the content of the units derived from NAH in the resin (X).

The contents of units other than the units derived from NAH were obtained by molten NMR analysis and fluorine content analysis.

(Melting Point)

Using a differential scanning calorimeter (DSC apparatus, manufactured by Seiko Instruments & Electronics Ltd.), the melting peak when the resin (X) was heated at a rate of 10° C./min was recorded, and the temperature (° C.) corresponding to the maximum value of the melting peak was taken as the melting point.

(Melt Flow Rate)

Using a melt indexer (manufactured by TECHNO SEVEN), the mass (g) of the resin (X) which flowed from a nozzle having a diameter of 2 mm and a length of 8 mm in 10 minutes at a temperature of 372° C. under a load of 49N was measured and taken as the melt flow rate (g/10 min).

(Dielectric Constant of Fluororesin)

Using a dielectric breakdown test apparatus (manufactured by YAMAYOSHIKENKI COM, YSY-243-100RHO), by transformer bridge method in accordance with ASTM D150, the dielectric constant of the resin (X) was measured at a frequency of 1 MHz in an environment at a temperature of 23° C.±2° C. under a relative humidity of 50%±5% RH.

(Dielectric Constant of Electrical Insulator Layer)

The copper foil of the laminate was removed by etching, and with respect to the exposed electrical insulator layer, using a split post dielectric resonator (manufactured by QWED, nominal fundamental frequency: 2.5 GHz), a vector network analyzer (manufactured by Keysight Technologies, E8361C) and dielectric constant calculation software (manufactured by Keysight Technologies, 85071E option 300), by split post dielectric resonator method (SPDR method), the dielectric constant of the electrical insulator layer at a frequency of 2.5 GHz in an environment at a temperature of 23° C.±2° C. under a relative humidity of 50±5% RH was measured.

(Linear Expansion Coefficient)

The copper foil of the laminate was removed by etching, and the exposed electrical insulator layer was cut into a strip of 4 mm×55 mm to prepare a sample. The sample was dried in an oven at 250° C. for 2 hours for conditioning. The sample was heated from 30° C. to 250° C. at a rate of 5° C./min using a thermal mechanical analyzer (manufactured by Seiko Instruments & Electronics Ltd., TMA/SS6100), in an air atmosphere at a distance between chucks of 20 mm under a load of 2.5 g (0.0245N), and the amount of displacement accompanying the linear expansion of the sample was measured. The linear expansion coefficient (ppm/° C.) from 50 to 100° C. was obtained from the amount of displacement of the sample from 50 to 100° C.

The contact angle between a single-sided copper-clad laminate as a sample and distilled water was measured by a contact angle meter (manufactured by Kyowa Interface Science Co., Ltd., CA-DT-A) at a temperature of 23° C. under a humidity of 50% RH. The contact angle was measured totally on 6 points, i.e. on both sides of three droplets, and the average value was obtained and taken as the water droplet contact angle. The diameter of the water droplet was 2 mm, and a value one minute after dropping was read.

(Initial Failure)

With respect to the wiring substrate (single-sided copper-clad laminate), the outer appearance of the plating layer formed on the inner wall surface of the hole was observed, and whether initial failure occurred or not was evaluated based on the following standards.

Excellent: the plating layer formed on the entire inner wall surface of the hole.

Failure: the plating layer formed partially on the inner wall surface of the hole, and a part of the inner wall surface of the hole exposed.

(Heat Resistance)

To evaluate heat resistance of the wiring substrate, a thermal shock test was conducted in accordance with the method of JIS C5012.

Figure 5:
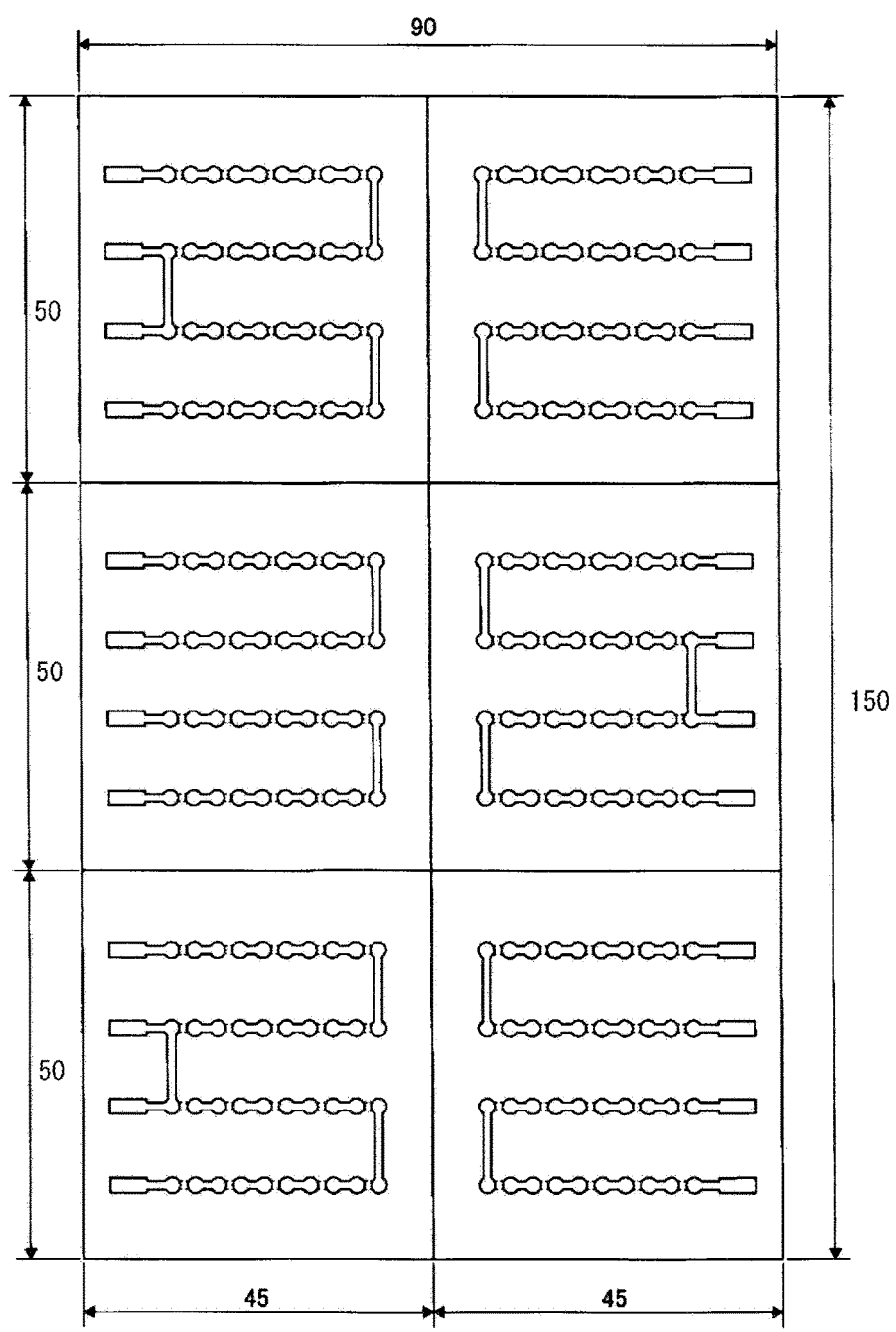
FIG. 5 is a drawing schematically illustrating a conduction circuit (daisy chain pattern) in Examples.

A copper foil on each side of the wiring substrate was processed to form a conductive circuit with a daisy chain pattern as shown in FIG. 5. The conductive circuit has 40 through-holes per one conductive circuit. The front side (continuous line) and the rear side (broken line) are alternately formed via through-holes. The unit of numerical values in FIG. 5 is mm.

With respect to the conductive circuit, the resistance from an end to the other end of one conductive circuit in the following thermal shock test was measured. For measurement of the resistance, multi-meter (manufactured by TEKTRONIX, INC., KETHLEY 2700) was used. The resistance at 260° C. during the thermal shock test was measured for 30 seconds, and the average of the resistances in 30 seconds was obtained.

In the thermal shock test, 100 cycles each comprising leaving the wiring substrate in an environment of 20° C. for 30 seconds and leaving it in an environment of 260° C. for 30 seconds were repeated. The heat resistance was evaluated from comparison between the resistance at 260° C. in the first cycle of the thermal shock test and the resistance at 260° C. in the 100th cycle.

(Materials)

NAH: 5-norbornene-2,3-dicarboxylic anhydride (manufactured by Hitachi Chemical Company, Ltd., himic anhydride)

AK225cb: 1,3-dichloro-1,1,2,2,3-pentafluoropropane (manufactured by Asahi Glass Company, Limited, AK225cb)

PPVE: $CF_2$=$CFO(CF_2)_3F$ (manufactured by Asahi Glass Company, Limited)

(Production of Resin Powder)

369 kg of AK225cb and 30 kg of PPVE were charged into a polymerization vessel equipped with a stirring machine having an internal capacity of 430 L which had been deaerated. Then, the interior of the polymerization vessel was heated to 50° C., 50 kg of TFE was charged, and the pressure in the polymerization vessel was elevated to 0.89 MPa [gauge]. A polymerization initiator solution having 0.36 mass % of (perfluorobutyryl)peroxide and 2 mass % of PPVE dissolved in AK225cb was prepared, and polymerization was conducted while 3 L of the polymerization initiator solution was continuously added to the polymerization vessel at a rate of 6.25 mL per minute. Further, TFE was continuously charged so that the pressure in the polymerization vessel during the polymerization reaction was kept at 0.89 MPa [gauge]. Further, a solution having 0.3 mass % of NAH dissolved in AK225cb was continuously charged in an amount corresponding to 0.1 mol % based on the number of moles of TFE to be charged during the polymerization reaction.

8 Hours after initiation of the polymerization, at a point when 32 kg of TFE was charged, the temperature in the polymerization vessel was decreased to room temperature, and the pressure was purged to normal pressure. The obtained slurry was subjected to solid-liquid separation from AK225cb, followed by drying at 150° C. for 15 hours to obtain 33 kg of granular copolymer (X1-1).

In the copolymer (X1-1), the contents (mol %) of the respective units were such that NAH units/TFE units/PPVE units=0.1/97.9/2.0. The content of the functional groups (G) in the copolymer (X1-1) was 470 groups per $1\times10^6$ carbon atoms in the main chain of the copolymer (X1-1), the melting point of the copolymer (X1-1) was 300° C., the melt flow rate of the copolymer (X1-1) was 17.6 g/10 min, and the dielectric constant of the copolymer (X1-1) was 2.1. The average particle size of the granular copolymer (X1-1) was 1,554 µm.

The granular copolymer (X1-1) was pulverized by a jet mill (manufactured by SEISHIN ENTERPRISE CO., LTD., Single Track Jet Mill FS-4) under a pulverization pressure of 0.5 MPa at a treatment rate of 1 kg/hour to obtain a crude resin powder. The crude resin powder was classified by a high efficiency precision air classifier (manufactured by SEISHIN ENTERPRISE CO., LTD., Classiel N-01) at a treatment rate of 0.5 kg/hour to obtain a resin powder. The yield of the resin powder obtained by classification was 89.4%, the average particle size of the resin powder was 2.3 µm, $D_{90}$ of the resin powder was 4.6 µm, and $D_{100}$ of the resin powder was 8.0 µm.

Example 1

(Preparation of Liquid Composition)

To a thermosetting modified polyimide varnish having epoxy groups (PI R&D CO., LTD., solvent: N-methylpyrrolidone, solid content: 15 mass %), the resin powder was added so that thermosetting modified polyimide/resin powder=75/25 (mass ratio), followed by stirring by a stirrer at 1,000 rpm for one hour. A vacuum degassing treatment was carried out for 2 hours to obtain a liquid composition. In the liquid composition, no agglomeration of the resin powder was observed apparently. The liquid composition was subjected to filtration through a 100 mesh filter, whereupon the resin powder did not agglomerate in the filter, and filtration of the liquid composition was possible.

(Production of Single-Sided Copper-Clad Laminate)

To the surface of an electrolytic copper foil (manufactured by Fukuda Metal Foil & Powder Co., Ltd., CF-T4X-SVR-12, thickness: 12 µm, surface roughness (Rz): 1.2 µm), the liquid composition which had been filtrated through the filter was applied so that the thickness of a coating film (electrical insulator layer) after drying would be 7 µm. The copper foil was heated in an oven at 90° C. for 5 minutes, at 120° C. for 5 minutes and at 150° C. for 5 minutes for drying to form an electrical insulator layer, thereby to obtain a single-sided copper-clad laminate. The powder average particle size in the electrical insulator layer was 2.5 µm. The water droplet contact angle of the electrical insulator layer was 83°.

On the single-sided copper-clad laminate, through-hole processing was conducted by using a UV-YAG laser (manufactured by esi, MODEL 5330xi) with a diameter set at 150 µm at an output of 2.4 W at a frequency of 40,000 Hz with 25 shots, to form through-holes having a surface diameter of 150 µm and a bottom diameter of 121 µm.

In order to remove resin residue on the inner wall surface of the through-holes of a single-sided copper-clad laminate, a desmear treatment (treatment with a permanganic acid solution) was applied to the inner wall surface of the through-holes of the single-sided copper-clad laminate. The single-sided copper-clad laminate having the through-holes formed therein was treated with a swelling liquid (a mixed liquid of MLB211 and CupZ in a mixing ratio of 2:1 by mass, manufactured by RHOM and HAAS) at a liquid temperature of 80° C. for a treatment time of 5 minutes, treated with an oxidizing liquid (a mixed liquid of MLB213A-1 and MLB213B-1 in a mixing ratio of 1:1.5 by mass, manufactured by RHOM and HAAS) at a liquid temperature of 80° C. for a treatment time of 6 minutes and treated with a neutralizer (MLB216-2 manufactured by RHOM and HAAS) at a liquid temperature of 45° C. for a treatment time of 5 minutes.

In order to form a plating layer on the inner wall surface of the through-holes in the single-sided copper-clad laminate after the desmear treatment, a plating treatment was applied to the inner wall surface of the through-holes in the single-sided copper-clad laminate. With respect to the plating treatment, a system solution is commercially available from RHOM and HAAS, and electroless plating was conducted using the system solution in accordance with the published procedure. The single-sided copper-clad laminate after the desmear treatment was treated with a cleaning fluid (ACL-009) at a liquid temperature of 55° C. for a treatment time of 5 minutes. After washing with water, the single-sided copper-clad laminate was subjected to a soft etching treatment with a sodium persulfate/sulfuric acid soft etching agent at a liquid temperature of room temperature for a treatment time of 2 minutes. After washing with water, the single-sided copper-clad laminate was subjected to an activation treatment with a treatment liquid (a mixed liquid of MAT-2-A and MAT-2-B in a volume ratio of 5:1) at a liquid temperature of 60° C. for a treatment time of 5 minutes. The single-sided copper-clad laminate was subjected to a reduction treatment with a treatment liquid (a mixed liquid of MAB-4-A and MAB-4-B in a volume ratio of 1:10) at a liquid temperature of 30° C. for a treatment time of 3 minutes so that a Pd catalyst to precipitate copper in electroless plating was deposited on the inner wall surface of the through-holes. After washing with water, the single-sided copper-clad laminate was subjected to a plating treatment with a treatment liquid (PEA-6) at a liquid temperature of 34° C. for a treatment time of 30 minutes to precipitate copper on the inner wall surface of the through-holes to form a plating layer. After formation of the plating layer on each of 30 through-holes, the cross-section of each through-hole was observed by a scanning electron microscope, whereupon the plating layer was formed on the entire inner wall surface of each through-hole. Initial failure such as peeling or formation failure of the plating layer was not observed.

(Production of Wiring Substrate)

A thermosetting modified polyimide varnish having epoxy groups (manufactured by PI R&D CO., LTD., solvent: N-methylpyrrolidone, solid content: 15 mass %) was applied to the surface of an electrolytic copper foil (manufactured by Fukuda Metal Foil & Powder Co., Ltd., CF-T4X-SVR-12, thickness: 12 µm, surface roughness (Rz): 1.2 µm) so that the thickness of a coating film (electrical insulator layer) after drying would be 6 µm. The copper foil was heated in an oven at 90° C. for 5 minutes, at 120° C. for 5 minutes and at 150° C. for 5 minutes for drying to form an electrical insulator layer, thereby to obtain a single-sided copper-clad laminate (1).

To a thermosetting modified polyimide varnish having epoxy groups (PI R&D CO., LTD., solvent: N-methylpyrrolidone, solid content: 15 mass %), the resin powder was added so that thermosetting modified polyimide/resin powder=75/25 (mass ratio), followed by stirring by a stirrer at 1,000 rpm for one hour. A vacuum degassing treatment was carried out for 2 hours to obtain a liquid composition. In the liquid composition, no agglomeration of the resin powder was observed apparently. The liquid composition was subjected to filtration through a 100 mesh filter, whereupon the resin powder did not agglomerate in the filter, and filtration of the liquid composition was possible.

To the surface of an electrolytic copper foil (manufactured by Fukuda Metal Foil & Powder Co., Ltd., CF-T4X-SVR-12, thickness: 12 µm, surface roughness (Rz): 1.2 µm), the liquid composition which had been filtrated through the filter was applied so that the thickness of a coating film (electrical insulator layer) after drying would be 12 µm. The copper foil was heated in an oven at 90° C. for 5 minutes, at 120° C. for 5 minutes and at 150° C. for 5 minutes for drying to form an electrical insulator layer, thereby to obtain a single-sided copper-clad laminate. The single-sided copper-clad laminate was subjected to an etching treatment to remove the copper foil thereby to obtain polyimide film (film 1).

The single-sided copper-clad laminate (1) was overlaid on both sides of the polyimide film (film 1) so that the copper foil would be the outermost layer, and heat-pressed in vacuum at a pressing temperature of 340° C. under a pressing pressure of 4.0 MPa for a pressing time of 15 minutes to obtain a double-sided copper-clad laminate. Of the electrical insulator layer (thickness: 24 µm), the dielectric constant was 3.2, and the linear expansion coefficient was 45 ppm/° C.

With respect to the double-sided copper-clad laminate, the copper foil was subjected to an etching treatment to form a daisy chain pattern, and in the same manner as the single-sided copper-clad laminate, through-holes were formed, and the plating layer was formed to obtain a wiring substrate. Heat resistance of the wiring substrate was evaluated. The resistance at 260° C. in the first cycle of the thermal shock test was 0.142Ω, and the resistance at 260° C. in the 100th cycle was 0.146Ω. The resistance increased only slightly, and the wiring substrate was found to be excellent in heat resistance.

Example 2

A double-sided copper-clad laminate was obtained in the same manner as in Example 1 except that to a thermosetting modified polyimide varnish having epoxy groups (manufactured by PI R&D CO., LTD., solvent: N-methylpyrrolidone, solid content: 15 mass %), the resin powder was added so that thermosetting modified polyimide/resin powder=85/15 (mass ratio). Of the electrical insulator layer (thickness: 24 µm), the dielectric constant was 3.3, the linear expansion coefficient was 47 ppm/° C., and the powder average particle size in the electrical insulator layer was 2.2 µm. The water droplet contact angle of the electrical insulator layer was 80°.

With respect to the double-sided copper-clad laminate, the copper foil was subjected to an etching treatment to form a daisy chain pattern, and in the same manner as the single-sided copper-clad laminate, through-holes were formed, and a plating layer was formed to obtain a wiring substrate. Heat resistance of the wiring substrate was evaluated. The resistance at 260° C. in the first cycle of the thermal shock test was 0.146Ω, and the resistance at 260° C. in the 100th cycle was 0.149Ω. The resistance increased only slightly, and the wiring substrate was found to be excellent in heat resistance.

Example 3

A double-sided copper-clad laminate was obtained in the same manner as in Example 1 except that to a thermosetting modified polyimide varnish having epoxy groups (manufactured by PI R&D CO., LTD., solvent: N-methylpyrrolidone, solid content: 15 mass %), the resin powder was added so that thermosetting modified polyimide/resin powder=59/41 (mass ratio). Of the electrical insulator layer (thickness: 24 µm), the dielectric constant was 3.0, the linear expansion coefficient was 50 ppm/° C., and the powder average particle size in the electrical insulator layer was 2.6 µm. The water droplet contact angle of the electrical insulator layer was 85°.

With respect to the double-sided copper-clad laminate, the copper foil was subjected to an etching treatment to form a daisy chain pattern, and in the same manner as the single-sided copper-clad laminate, through-holes were formed, and a plating layer was formed to obtain a wiring substrate. Heat resistance of the wiring substrate was evaluated. The resistance at 260° C. in the first cycle of the thermal shock test was 0.150Ω, and the resistance at 260° C. in the 100th cycle was 0.151Ω. The resistance increased only slightly, and the wiring substrate was found to be excellent in heat resistance.

Example 4

A double-sided copper-clad laminate was obtained in the same manner as in Example 1 except that to a thermosetting modified polyimide varnish having epoxy groups (manufactured by PI R&D CO., LTD., solvent: N-methylpyrrolidone, solid content: 15 mass %), the resin powder was added so that thermosetting modified polyimide/resin powder=40/60

(mass ratio). Of the electrical insulator layer (thickness: 24 μm), the dielectric constant was 2.8, the linear expansion coefficient was 64 ppm/° C., and the powder average particle size in the electrical insulator layer was 2.7 μm. The water droplet contact angle of the electrical insulator layer was 91°.

With respect to the double-sided copper-clad laminate, the copper foil was subjected to an etching treatment to form a daisy chain pattern, and in the same manner as the single-sided copper-clad laminate, through-holes were formed, and a plating layer was formed to obtain a wiring substrate. Heat resistance of the wiring substrate was evaluated. The resistance at 260° C. in the first cycle of the thermal shock test was 0.140Ω, and the resistance at 260° C. in the 100th cycle was 0.146Ω. The resistance increased only slightly, and the wiring substrate was found to be excellent in heat resistance.

Comparative Example 1

To a thermosetting modified polyimide varnish having epoxy groups (manufactured by PI R&D CO., LTD., solvent: N-methylpyrrolidone, solid content: 15 mass %), a PTFE dispersion (manufactured by Asahi Glass Company, Limited, AD-911E, average particle size: 0.25 μm) was added so that thermosetting modified polyimide/PTFE powder=70/30 (mass ratio), followed by stirring by a stirrer at 1,000 rpm for one hour. A vacuum degassing treatment was carried out for 2 hours to obtain a liquid composition. The liquid composition was subjected to filtration through a 100 mesh filter, whereupon the resin powder partly agglomerated and was trapped on the filter.

In the same manner as in Example 1, the liquid composition which had been filtrated through the filter was applied to the surface of an electrolytic copper foil so that the thickness of a coating film (electrical insulator layer) after drying would be 7 μm. The copper foil was heated in an oven at 90° C. for 5 minutes, at 170° C. for 5 minutes and at 220° C. for 5 minutes for drying to form an electrical insulator layer, thereby to obtain a single-sided copper-clad laminate. The powder average particle size in the electrical insulator layer was 8.5 μm. The water droplet contact angle of the electrical insulator layer was 81°.

In the same manner as in Example 1, in the obtained single-sided copper-clad laminate, through-holes having a surface diameter of 150 μm and a bottom diameter of 121 μm were formed.

In the same manner as in Example 1, a desmear treatment was applied to the inner wall surface of each through-hole and then a plating treatment was applied. A plating layer was formed on each of the 30 through-holes, and the cross-section of each through-hole was observed by a scanning electron microscope, whereupon the plating layer was not formed entirely or partly on the inner wall surface of each through-hole, and initial failure such as peeling or formation failure of the plating layer was observed.

In the same manner as in Example 1, a double-sided copper-clad laminate was prepared. With respect to the double-sided copper-clad laminate, an etching treatment was applied to the copper foil to form a daisy chain pattern, and in the same manner as in the single-sided copper-clad laminate, through-holes were formed, and a plating layer was formed to obtain a wiring substrate. Heat resistance of the wiring substrate was evaluated. The resistance at 260° C. in the first cycle of the thermal shock test was 0.170Ω, and the resistance at 260° C. in the 100th cycle was 1.23Ω. The resistance significantly increased, and the wiring substrate was found to have sufficient heat resistance.

Comparative Example 2

In the same manner as in Comparative Example 1, a liquid composition was prepared so that thermosetting modified polyimide/PTFE powder=90/10 (mass ratio). The liquid composition was subjected to filtration through a 100 mesh filter, whereupon the resin powder partly agglomerated and was trapped on the filter.

In the same manner as in Comparative Example 1, a single-sided copper-clad laminate was prepared. The powder average particle size in the electrical insulator layer was 10.1 μm. The water droplet contact angle of the electrical insulator layer was 81°. In the obtained single-sided copper-clad laminate, through-holes having a surface diameter of 148 μm and a bottom diameter of 120 μm were formed.

In the same manner as in Example 1, a desmear treatment was applied to the inner wall surface of each through-hole, and a plating treatment was applied. A plating layer was formed on each of the 30 through-holes, and the cross-section of each through-hole was observed by a scanning electron microscope, whereupon the plating layer was not formed entirely or partly on the inner wall surface of each through-hole, and initial failure such as peeling or formation failure of the plating layer was observed.

In the same manner as in Example 1, a double-sided copper-clad laminate was prepared. With respect to the double-sided copper-clad laminate, an etching treatment was applied to the copper foil to form a daisy chain pattern, and in the same manner as in the single-sided copper-clad laminate, through-holes were formed, and a plating layer was formed to obtain a wiring substrate. Heat resistance of the wiring substrate was evaluated. The resistance at 260° C. in the first cycle of the thermal shock test was 0.191Ω, and the resistance at 260° C. in the 100th cycle was 1.49Ω. The resistance significantly increased, and the wiring substrate was found to have insufficient heat resistance.

INDUSTRIAL APPLICABILITY

The wiring substrate of the present invention is useful as an antenna to conduct high-speed large-capacity radio communication in communication equipment (such as mobile phones), automobiles, etc.; a substrate for electronic equipment for which high frequency characteristics are required, a substrate for various sensors or a substrate for engine management sensors for automobiles, etc.

This application is a continuation of PCT Application No. PCT/JP2017/031471, filed on Aug. 31, 2017, which is based upon and claims the benefit of priority from Japanese Patent Application No. 2016-171195 filed on Sep. 1, 2016. The contents of those applications are incorporated herein by reference in their entireties.

REFERENCE SYMBOLS

10: wiring substrate, 12: laminate, 14: laminate, 20: electrical insulator layer, 22: heat resistant resin layer, 24: first adhesive layer, 26: second adhesive layer, 32: first conductor layer, 34: second conductor layer, 40: hole, 42: plating layer.

What is claimed is:

1. A wiring substrate comprising:
   an electrical insulator layer,
   a first conductor layer formed on a first surface of the electrical insulator layer,
   a second conductor layer formed on a second surface opposite from the first surface of the electrical insulator layer, and
   a plating layer formed on an inner wall surface of a hole which opens from the first conductor layer through the second conductor layer,
   wherein the electrical insulator layer has a heat resistant resin layer containing a heat resistant resin and a resin powder,
   the resin powder is formed from a resin material containing a melt-formable fluororesin having at least one type of functional group selected from the group consisting of a carbonyl group-containing group, a hydroxy group, an epoxy group and an isocyanate group,
   the content of the resin powder is from 5 to 70 mass % to the heat resistant resin layer, and
   the electrical insulator layer has a dielectric constant of from 2.0 to 3.5.

2. The wiring substrate according to claim 1, wherein the fluororesin has a melting point of at least 260° C.

3. The wiring substrate according to claim 1, wherein the at least one type of functional group is a carbonyl group-containing group, and the carbonyl group-containing group is at least one member selected from the group consisting of a group having a carbonyl group between carbon atoms of a hydrocarbon group, a carbonate group, a carboxy group, a haloformyl group, an alkoxycarbonyl group and an acid anhydride residue.

4. The wiring substrate according to claim 1, wherein the content of the functional groups in the fluororesin is from 10 to 60,000 groups per $1 \times 10^6$ carbon atoms in the main chain of the fluororesin.

5. The wiring substrate according to claim 1, wherein the electrical insulator layer has a dielectric constant of from 2.0 to 3.0.

6. The wiring substrate according to claim 1, wherein the electrical insulator layer has a linear expansion coefficient of from 0 to 100 ppm/° C.

7. The wiring substrate according to claim 1, wherein the average particle size of the resin powder to be added to the heat resistant resin layer is from 0.02 to 5 μm, and the volume-based accumulative 90% size ($D_{90}$) of the resin powder is at most 6 μm.

8. The wiring substrate according to claim 1, wherein the water droplet contact angle of the electrical insulator layer is from 60° to 100°.

9. The wiring substrate according to claim 1, wherein the average particle size of the resin powder contained in the electrical insulator layer is from 1 to 7 μm.

10. The wiring substrate according to claim 1, wherein the rate of change of the resistance of the wiring substrate at 260° C. in the 100th cycle of a thermal shock test to the resistance of the wiring substrate at 260° C. in the first cycle of a thermal shock test is within ±10%.

11. A process for producing the wiring substrate as defined in claim 1, which comprises:
    forming the hole in a laminate comprising the first conductor layer, the electrical insulator layer and the second conductor layer laminated in this order;
    applying a pre-treatment to the inner wall surface of the hole, and
    forming the plating layer on the inner wall surface of the hole having a pre-treatment applied thereto.

12. A process for producing the wiring substrate as defined in claim 1, which comprises:
    forming the hole in a laminate having the first conductor layer laminated on the first surface of the electrical insulator layer;
    applying a pre-treatment to the inner wall surface of the hole,
    forming the plating layer on the inner wall surface of the hole having a pre-treatment applied thereto, and
    forming the second conductor layer on the second surface of the electrical insulator layer.

13. The process for producing the wiring substrate according to claim 11, wherein as the pre-treatment, either one or both of a treatment with a permanganic acid solution and a plasma treatment is conducted without conducting an etching treatment using metal sodium.

* * * * *